Figure 1:
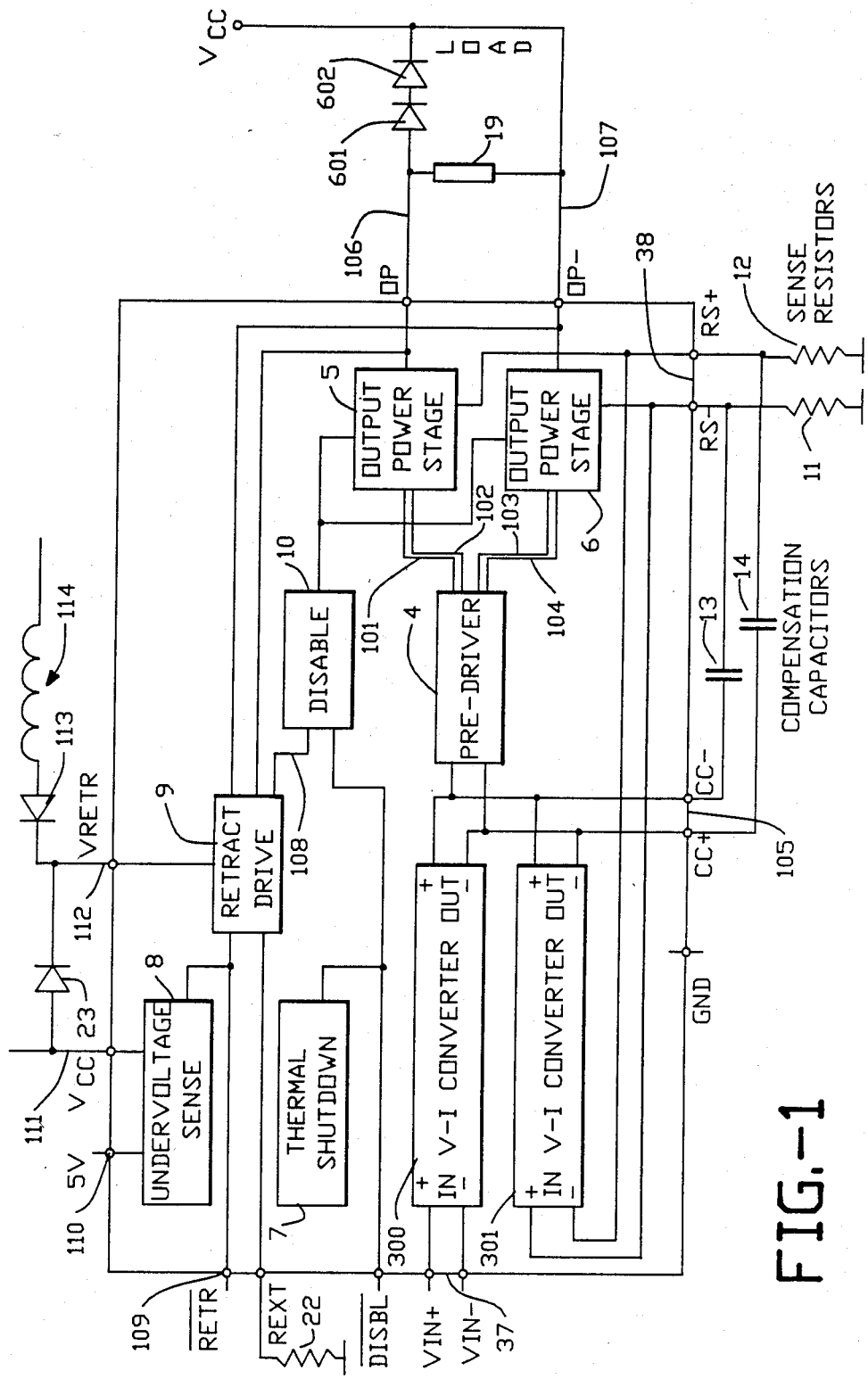

United States Patent [19]

Pennock

[11] Patent Number: 4,885,517
[45] Date of Patent: Dec. 5, 1989

[54] VOICE COIL ACTUATOR POSITIONING AMPLIFIER

[75] Inventor: John L. Pennock, Edinburgh, Scotland

[73] Assignee: Seagate Technology, Inc., Scotts Valley, Calif.

[21] Appl. No.: 208,894

[22] Filed: Jun. 20, 1988

[51] Int. Cl.$^4$ .............................................. G05F 1/00
[52] U.S. Cl. ..................................... 318/678; 318/293; 318/599; 318/681; 363/41; 363/98; 180/79.1
[58] Field of Search ............... 318/678, 293, 599, 681, 318/679; 363/41, 98; 180/79.1

[56] References Cited

U.S. PATENT DOCUMENTS 4,066,945 1/1978 Korte ................................... 318/681
4,528,514 7/1985 Quackerbush ....................... 330/146
4,568,863 2/1986 Ruof .................................... 318/269
4,719,396 1/1988 Shimizu .............................. 318/432

Primary Examiner—William M. Shoop, Jr.
Assistant Examiner—Saul M. Bergmann
Attorney, Agent, or Firm—Flehr, Hohbach, Test, Albritton & Herbert

[57] ABSTRACT

A signal amplifier including a bridge output stage, a comparator stage arranged to control a first part of the output stage in accordance with the polarity of an input signal, and a modulating stage arranged to control a second part of the output stage in accordance with the magnitude and polarity of the input signal. The signal amplifier is particularly suitable for fabrication as an integrated circuit.

16 Claims, 6 Drawing Sheets

VOICE COIL ACTUATOR POSITIONING AMPLIFIER

The present invention relates to signal amplifiers, particularly amplifiers of control signals for electro-mechanical control.

Signal amplifiers are required in electro-mechanical equipment in which actuators, usually actuators which include a motor coil, are used to effect the movement of a part of the equipment in response to an electrical control signal. An example electro-mechanical equipment employing an actuator which includes a motor coil is a magnetic storage disc drive arrangement in which a linear actuator is used to position the magnetic reading and writing heads at a particular track of the magnetic disc, and to retract the reading and writing heads.

In accordance with the present invention a signal amplifier includes a bridge-connected output stage, a comparator stage arranged to control a first part of the output stage in accordance with the polarity of an input signal, and a modulating stage arranged to control a second part of the output stage in accordance with the magnitude and polarity of the input signal.

In one form of the amplifier, the arrangement is such that, in operation, the first part of the output stage is switched and the second part of the output stage is conductance modulated.

In one embodiment of the invention, the modulating stage is arranged to control the comparator stage, and additionally, the comparator stage is arranged to control two arms of the bridge-connected output stage, which may be the upper or the lower arms of the bridge-connected output stage.

Preferably, the amplifier is so arranged that control devices, which may be transistors, forming two arms of the bridge-connected output stage are conductive when the input signal amplitude is zero, and the appropriate one of the control devices becomes non-conductive, according to the input signal polarity, as the input signal deviates from zero magnitude.

In the arrangement in which the control devices forming the previously mentioned, or first, two arms of the bridge-connected output stage are conductive when the input signal is zero, further control devices, which may also be transistors, forming the two further arms of the bridge-connected output stage are both non-conductive when the input signal has zero magnitude, and the appropriate one of the further control devices conducts, according to the input signal polarity and magnitude, as the input signal deviates form zero magnitude, to provide an output signal across a load connected to the amplifier output port.

Preferably, the amplifier is so arranged that each of the further control devices becomes conductive after the first control device located in the opposite arm of the bridge-connected output stage is conductive, as the input signal moves away from zero magnitude. Preferably, the amplifier output stage includes a biassing network arranged to provide set conditions at the amplifier output port at times when the input signal is such that the states of the control devices would leave the output conditions indeterminate. The biassing network may be arranged to include a low-level current source between the higher level supply voltage terminal and the terminals of the output port, and current bleed paths between the terminals of the output port and the lower level supply voltage terminal.

Preferably the modulating stage is arranged to provide a current dependent on the magnitude of the input signal for driving the output stage.

Preferably, the modulating stage includes a first amplifier network arranged to receive an input signal, a second amplifier network arranged to receive a feedback signal from the output stage, and a summing amplifier network arranged to receive the output signals from the first and second amplifier networks.

Preferably the amplifier networks are provided with differential-input ports.

In one embodiment of the invention, a feedback network is connected between the output stage and the second amplifier network for amplifier bandwidth control. Suitable bandwidth-setting feedback networks include a purely capacitive network, a capacitor-resistor network, a network including capacitors in combination with buffer amplifiers, or a network including capacitors in combination with current amplifiers.

Preferably, the signal amplifier includes a voltage monitoring network arranged to monitor the amplifier voltage supply and to control a network for effecting shut-down of the amplifier, the monitoring network being arranged to signal the shut-down network when the voltage supply is below a set value, to effect shut-down on the amplifier.

Preferably, the signal amplifier includes a "retract" network arranged to receive supply energy independently of the amplifier voltage supply and to provide energy directly to the amplifier output port when the voltage monitoring network signals that the voltage supply is below the set value, the "retract" network, in operation of the amplifier, being capable of returning an actuator to its start position during conditions when the voltage monitoring network is signalling that the voltage supply is below the set value, and, preferably, the "retract" network is arranged to provide a constant current to the amplifier output port. Such a "retract" network operates to return the actuator to its start position with constant acceleration.

Alternatively, the "retract" network may be arranged to provide a constant voltage (with some current limit) at the amplifier output port, in which case the actuator is returned to its start position at a substantially constant rate.

Preferably, the signal amplifier includes a network arranged to monitor the operating temperature of components of the output stage and to control a network for effecting shut-down of the amplifier, the temperature monitoring network being arranged to signal to the shut-down network when the operating temperature of a component of the output stage exceeds a set level, to effect shut-down of the amplifier, and, the temperature monitoring network may be arranged to also activate the "retract" network.

Advantageously, a bridge-connected output stage, a comparator stage, and a modulating stage are fabricated as a monolithic integrated circuit suitable for constructing the signal amplifier, and, preferably, the monolithic integrated circuit includes not only the bridge-connected output stage, the comparator stage, and the modulating stage, but also a voltage monitoring network and a shut-down network.

Advantageously, the monolithic integrated circuit includes a "retract" network for retracting an actuator under conditions of power supply loss, and, preferably, the monolithic integrated circuit includes a temperature monitoring network for shutting down the amplifier and for activating the "retract" network when the temperature of an output stage component exceeds a set level.

Figure 2:
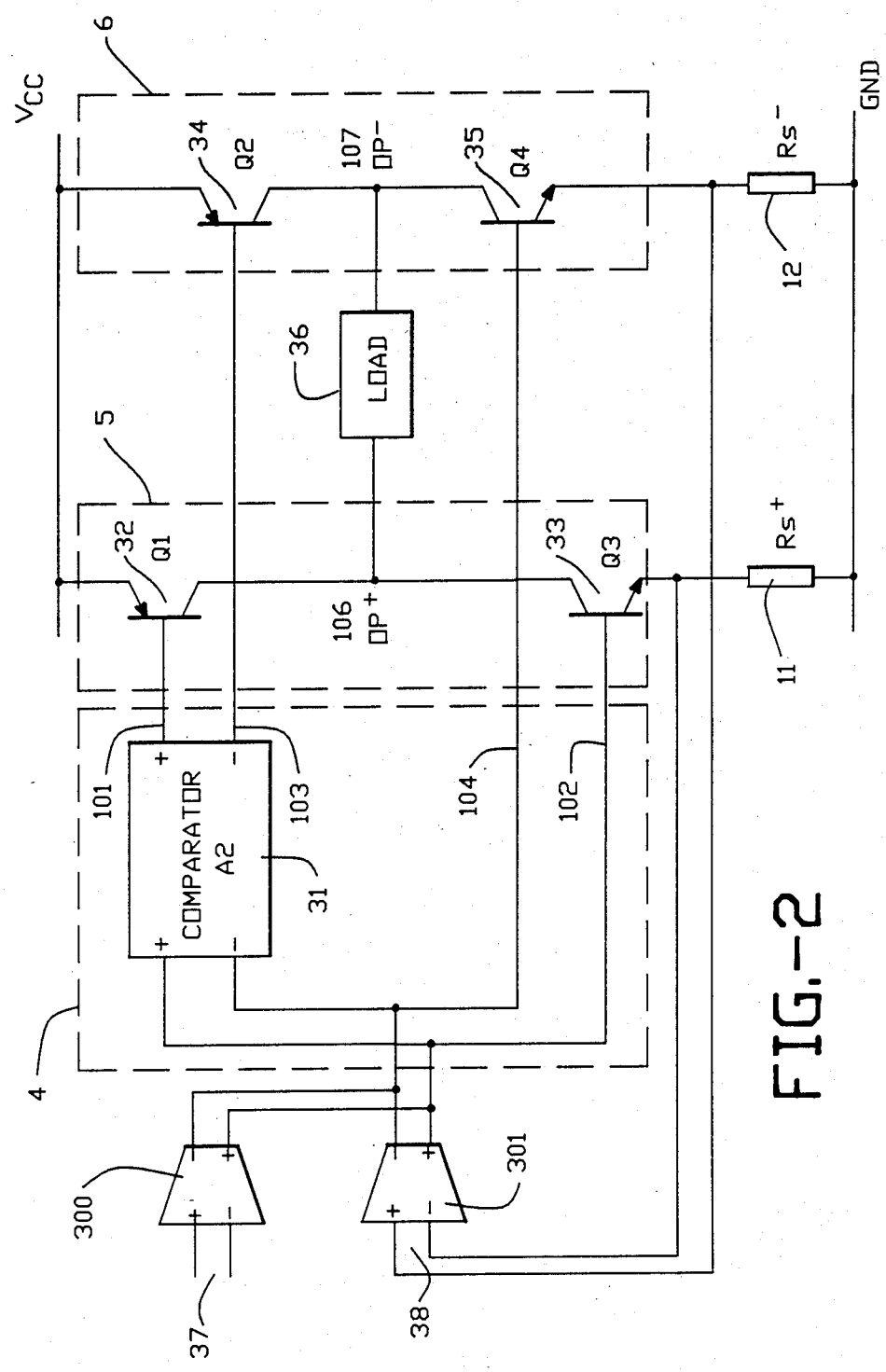
Figure 3:
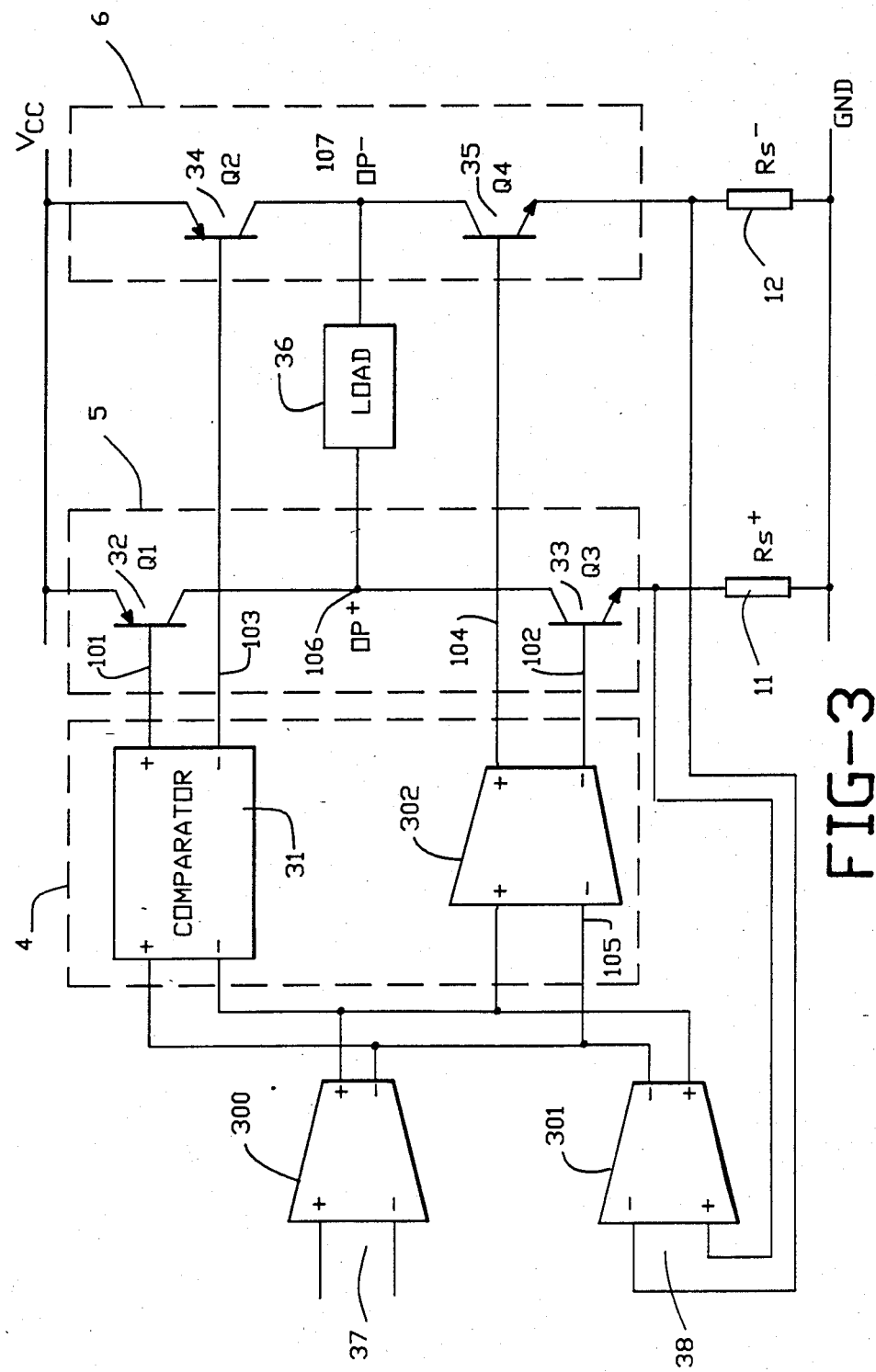
Figure 4:
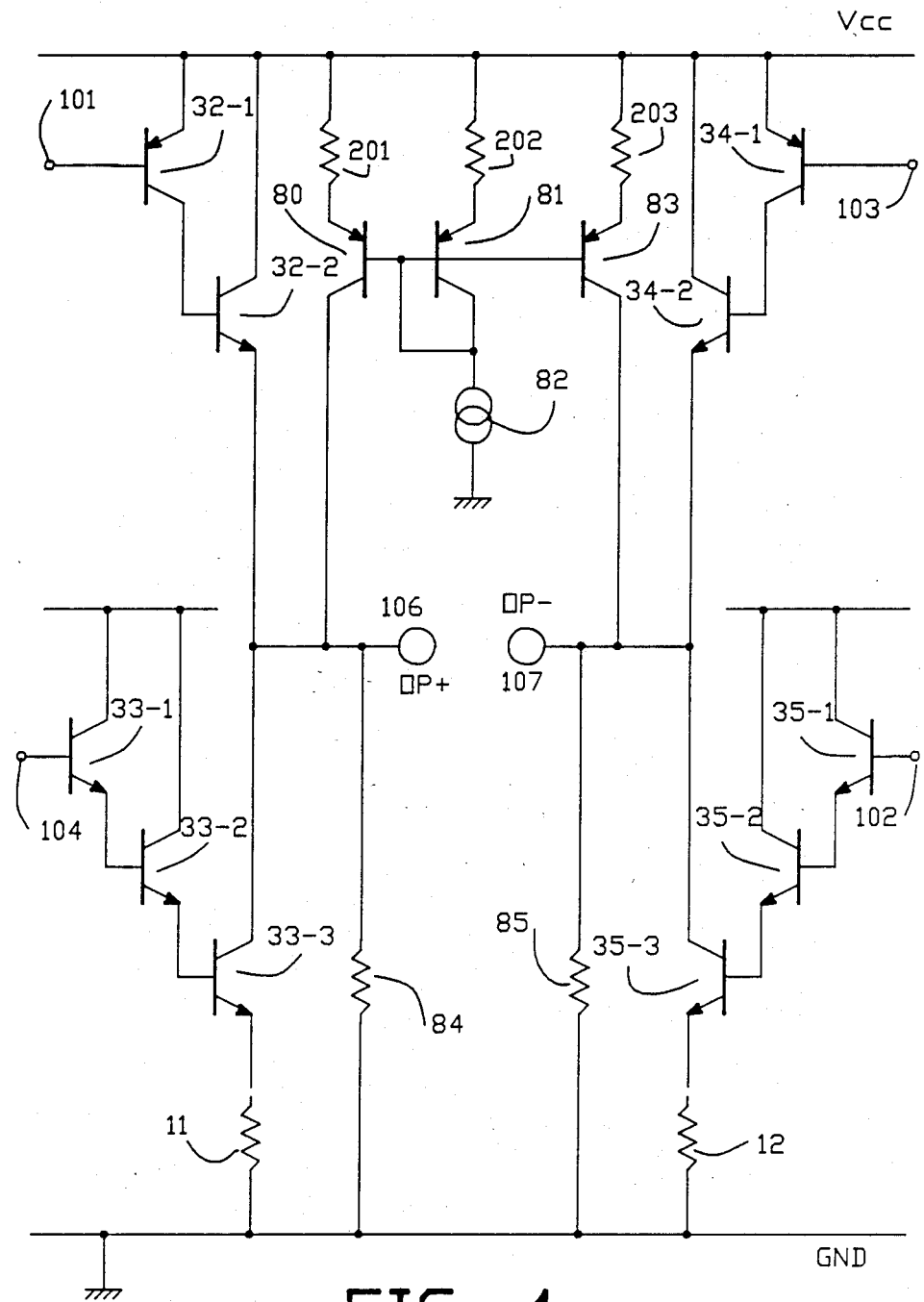
Figure 5:
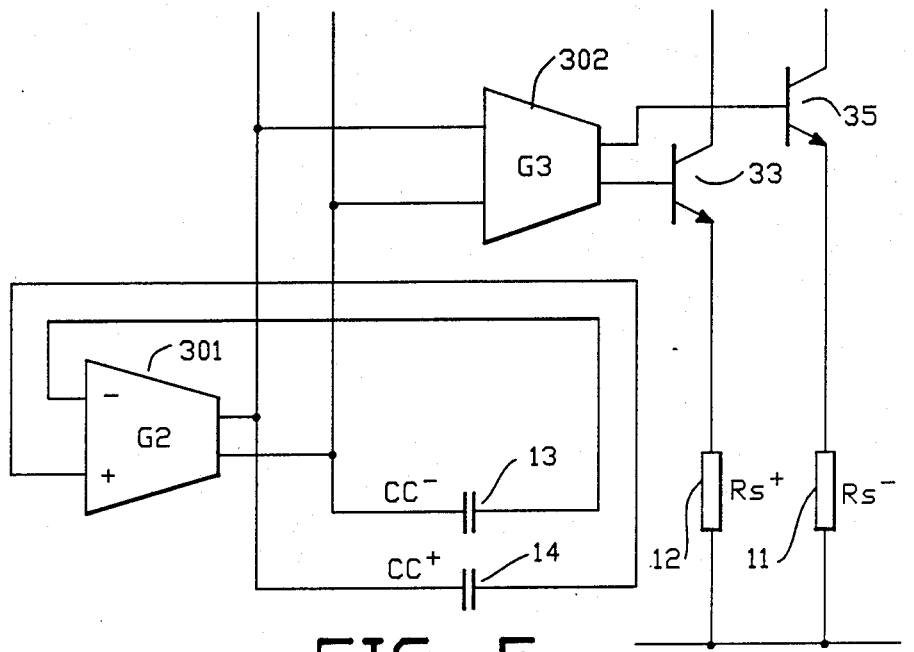
Figure 6:
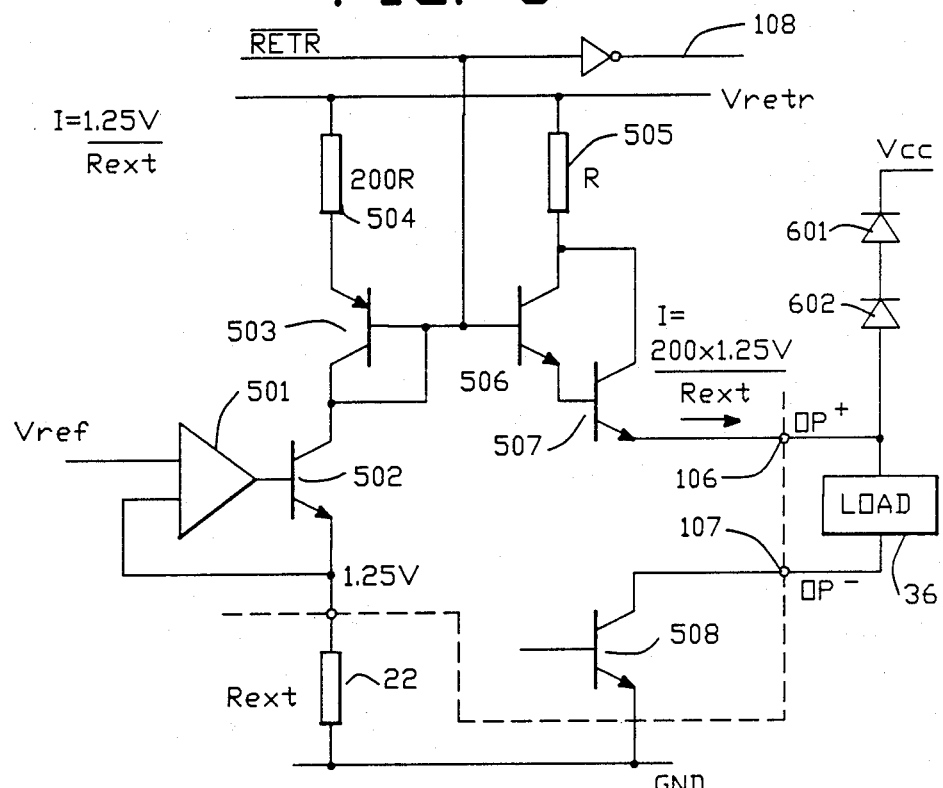
Figure 7:
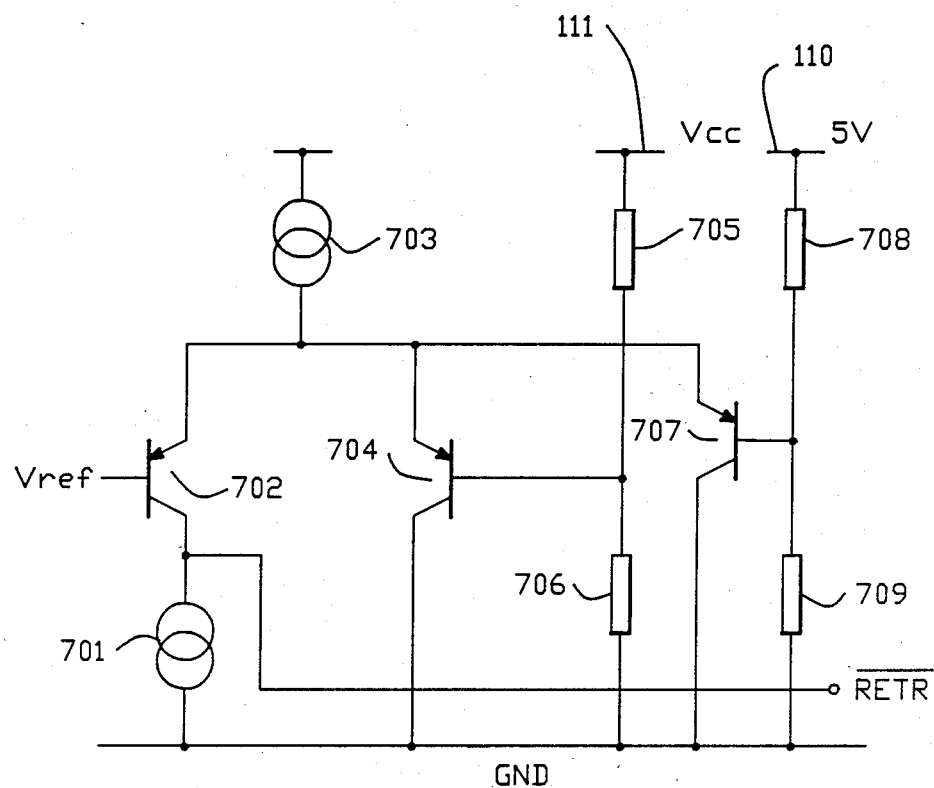

A signal amplifier in accordance with the present invention will now be described by way of example only, and with reference to the accompany drawings, in which:

FIG. 1 is a block diagram representation of a signal amplifier, in accordance with the present invention, for driving a linear actuator coil in a magnetic disc drive arrangement, FIG. 2 is a block diagram representation of a possible arrangement of the input, intermediate, and output amplifying stage of the amplifier of FIG. 1, FIG. 3 is a block diagram representation of a practical arrangement of the input, intermediate, and output amplifying stages of the amplifier of FIG. 1, FIG. 4 is a more detailed representation of the output stages than is shown in FIG. 3, FIG. 5 is a diagrammatic representation of the connection of bandwidth-setting components between the input and output stages of the amplifier of FIG. 1, FIG. 6 is a diagrammatic representation of a "retract" network included in the signal amplifier of FIG. 1, FIG. 7 is a diagrammatic representation of supply voltage monitoring network included in the signal amplifier of FIG. 1.

Referring now to FIG. 1, a signal amplifier for driving a load 36, such as a linear actuator coil in a magnetic disc drive arrangement is shown. The signal amplifier includes a first transconductance amplifier 300 having a control input port 37 which provides the control input port for the signal amplifier, and a second transconductance amplifier 301. A pre-driver stage 4 is electrically coupled to the output of amplifiers 300 and 301. An output driver stage 5 is driven by the output of the predriver 4 by electrical connectors 101 and 102, respectively. An output driver stage 6 is also driven by the output of the predriver 4 by electrical connectors 103 and 104, respectively. A load network 36 and two diodes 601 and 602 are connected between the output drive stages 5 and 6 of the signal amplifier at the positive output port OP+ node 106 and the negative output port OP— node 107, respectively.

An undervoltage sensing stage 8 is energized by a 5 volt source 110. The output of the sensing stage 8 is electrically connected to a retract state drive 9. The retract state drive 9 is energized externally through a supply voltage input port VRETR 112 comprising diode 113 and inductor 114. Diode 23 is connected to Vcc at node 111 at one end and VRETR 112 at the other end to node 111. A current setting resistor 22 connected between REXT and DISDL is also coupled to a second input of retract drive 9. A disable stage drive 10 input is coupled to the retract drive 9 output via electrical connector 108. A thermal shut down stage 7 is electrically connected to a second input of disposable stage drive 10.

Current sensing resistor 11 and RS— are serially coupled between RS— and the output power stage 6 and ground. The current sensing resistor 12 and RS+ are serially coupled between RS and power stage 5 and ground. Together, RS— and RS+ form a port 38. CC+ and CC— form another port 105. Compensation capacitor 13 is electrically coupled between CC— and RS—, and a second compensating capacitor 14 is coupled between CC+ and RS+. Node 105 including CC+ and CC— is connected to a ground point.

The load 36 represents the coil of a linear actuator for moving the writing and reading heads of a magnetic disc drive arrangement.

In the operation of the signal amplifier of FIG. 1, the control input voltage applied to the input port 37 is converted into a current by means of the first transconductance amplifier 300. A measure of the actual output current of the amplifier 300 is provided by the current sensing resistors 11 and 12, connected to respective ones of the output power drive stages 5 and 6. The voltage developed across the current sensing resistors is used to control the second transconductance amplifier 301. The amplifiers 300 and 301 provide drive power for the predriver stage 4, the output current from which is amplified by the output power drive stages 5 and 6. The OP+ node 106 and OP— node 107 provide the output port of the signal amplifier.

The thermal shut-down stage 7 is arranged to operate through the "disable" stage 10 to shut down the output power drive stages 5 and 6 in the event that the temperature of an output stage device at either node 106 or 107 exceeds a desired operating temperature for that device. The undervoltage sensing stage 8 responds to a low voltage condition at any of the power supply input ports by activating the "retract" stage 9, and the "disable" stage 10 operates to force each of the output power drive stages 5 and 6 to a zero output current state when its control input port ISABLE)/ is held at a low voltage. The resistor 22 sets the current which the "retract" stage 9 is able to supply to the amplifier output port to energize the load 36 when the "retract" function is executed.

The supply voltage input port VRETR 112 is available for connection to the winding of a rotary drive motor used elsewhere in the disc drive arrangement, for example, the spindle motor, in order to use the spindle motor as an energy source for energizing the load 36 under supply voltage loss conditions. The diode 23 ensures that the voltage level is high at the input port VRETR, at switch-on, and also permits the "retreat" stage 9 to be energized by the general supply voltage in order that the "retract" stage may be used to perform the retract function under normal operating conditions. In normal operating conditions, that is, in the absence of an undervoltage condition, the "retract" stage 9 may be activated by means of the appropriate signal applied to the $\overline{\text{RETR}}$ input port 109 in order to effect the return of an actuator controlled by the amplifier 300 to its start position. The signal for causing the execution of the retract function during normal operating conditions will be provided by the external control system for the amplifier.

Referring now to FIG. 2, a block diagram of one embodiment of an arrangement of the input, intermediate and output amplifying stages of the transconductance amplifiers 300 and 301 is shown. The signal amplifier 300 includes an input amplifier stage input port 37. The second amplifier 301 has a second input port 38, which is electrically connected to sense resistors 11 and 12.

In the intermediate stage, the positive and negative outputs of amplifiers 300 and 301 are respectively tied together. Accordingly, the sum of the two positive amplifier outputs and the negative outputs are applied to the input of pre-driver 4. The pre-driver 4 includes a comparator stage 31 which is adapted to receive the summed positive and negative amplifier output valves.

Describing the output amplifier stage in detail, the positive output from comparator 31 is coupled to the gate of transistor 32 by electrical connector 101, and the negative output of comparator 31 is coupled to the gate of transistor 34 by electrical connector 103. Similarly, the positive output from amplifier 302 is connected to the gate of transistor 35, while the negative output of amplifier 302 is connected to the gate of transistor 33.

The collectors of transistors 32 and 34 are respectively connected to Vcc, and the emitters of the two transistors are connected to the collectors of transistors 33 and 35 respectively. The OP+ node 106 is connected between transistors 32 and 33 and forms the output of power stage 5 connected to load 36. The OP− node 107 is connected between transistors 32 and 33 and forms the output for power stage 6 connected to load 36.

The emitter of transistor 33 is serially connected to sense resistor 12 and ground and the emitter of transistor 33 is fed back to the positive input transconductance amplifier 301. The emitter of transistor 35 is serially connected to sense resistor 11 and ground, and the emitter of transistor 35 is fed back to the negative input of transconductance amplifier 301. Together the emitter outputs of transistors 33 and 35 form port 38 into amplifier 301.

Discussing the operation of the circuit of FIG. 2, the amplifier 300 is driven by the signal applied to the input port 37. The amplifier 301 is driven by the feedback signals from resistors R12 and R11, respectively. The summed output valves of amplifiers 300 and 301 generate an output signal dependent on the difference between the signal applied to the input port 37 and the feed back signal applied to the input port 38. The output signal from the amplifiers 300 and 301 are such as to switch on either the transistors 32 and 35, as a pair, to drive current in one direction through the load 36, or to switch on the transistors 33 and 34, as a pair, to drive current in the other direction through the load 36. The amplifier 31 accomplishes this switching effect. The output signal from the comparator 31 is such as to cause either the transistor 32, or the transistor 34, to become fully conductive, while the summed output signals of the amplifiers 300 and 301 are such as to cause either the transistor 33, or the transistor 35, to regulate the current flow. At the zero output current conditions, both the transistors 32 and 34 are switched on and both the transistors 33 and 35 are switched off. When an input signal at the input port 37 appears, either the transistor 32 or the transistor 34 is switched off and the appropriate one of the transistors 33 and 35 is switched on. The transistors 33 and 35 are so biassed as to give a small dead-band during conduction switch-over in order to avoid shoot-through current at switch-over. The transistors are shown as single devices but may be compound devices where high supply voltages are to be used or improved current control is required.

Referring now to FIG. 3, a block diagram of the signal amplifier of FIG. 1 having input (amplifiers 300 and 301), intermediate (amplifier 302 and comparator 31) and output amplifier (transistors 32 through 35 and sense resistors 11 and 12) stages are shown. The input amplifier includes transconductance amplifier stages 300 and 301. The positive outputs of the two amplifiers are summed, and the two negative outputs of the amplifiers are also summed together. The intermediate amplifier is connected to the output of the two transconductance amplifiers, and comprise comparator 31 adapted to compare the summed positive and negative output signals and an intermediate amplifier 302 also adapted to compare the positive and negative signals. Together, comparator 31 and intermediate amplifier 302 form the pre-driver stage 4 shown in FIG. 1.

The input control voltage applied to the input port 37 of the transconductance amplifier 300 generates a first differential output current; the fed-back signal applied to port 38 of the transconductance amplifier 301 generates a second differential output current. These first and second differential currents are summed with appropriate relative polarity to give a third differential output current proportional to the difference between the input control voltage and the fed-back signal. This third differential current is imposed on the high-impedance nodes 105 to give a signal voltage on 105. This signal voltage is then applied to the pre-driver stage 4 comprising intermediate amplifier 302 and, in parallel, comparator 31.

The output amplifier stage comprises a transistor bridge network including transistors 32 through 35. More particularly, transistors 32 and 33 form output power stage 5 as shown in FIG. 1, and transistors 34 16 and 35 from output power stage 6 as shown in FIG. 1.

Describing the output amplifier stage in detail, the positive output from comparator 31 is coupled to the gate of transistor 32 by electrical connector 101, and the negative output of comparator 31 is coupled to the gate of transistor 34 by electrical connector 103. Similarly, the positive output from amplifier 302 is connected to the gate of transistor 35, while the negative output of amplifier 302 is connected to the gate of transistor 33.

The collectors of transistors 32 and 34 are respectively connected to Vcc, and the emitters of the two transistors are connected to the collectors of transistors 33 and 35 respectively. The OP+ node 106 is connected between transistors 32 and 33 and forms the output of power stage 5 connected to load 36. The OP− node 107 is connected between transistors 32 and 33 and forms the output for power stage 6 connected to load 36.

The emitter of transistor 33 is serially connected to sense resistor 12 and ground, and the emitter of transistor 33 is fed back to the positive input transconductance amplifier 301. The emitter of transistor 35 is serially connected to sense resistor 11 and ground, and the emitter of transistor 35 is fed back to the negative input of transconductance amplifier 301. Together the emitter outputs of transistors 33 and 35 form port 38 into amplifier 301.

Describing the operation of the circuit shown in FIG. 3, the input control voltage applied to the input port 37 of the transconductance amplifier 300 is summed with the fed back signal applied to the input port 38 of the transconductance amplifier 301 at the output of the two transconductance amplifiers, and the resulting signal is used to provide the modulating current for the transistors 33 and 35 by way of the intermediate amplifier 302. The transconductance of the amplifier 301 is larger than that of the amplifier 300, the ratio of these two transconductances determining the ratio of the input voltage to the input port 37 to the fed back voltage to the input port 38. For example, if it is required that the maximum input voltage to the input port 37 should be of the order of 3 volts (differential input) and the fed back voltage should not exceed 0.6 volts, then the ratio of the transconductance of the amplifiers 301 and 300 will be 5:1. It is, of course, advantageous to arrange for operation with a small fed-back voltage since the fed-back voltage represents a loss in output voltage. For the proposed 5:1 ratio of the transconductance of the amplifier 301 to that of the amplifier 300, the overall transconductance will be $0.2/R_{sense}$, providing a transconductance of the order of 1 amp/volt when $R_{sense}$ is of the order of 0.2 ohm, where $R_{sense}$ is the value of the resistor 11 or the resistor 12. The differential input arrangement to the amplifier 301 acts to suppress common mode noise generated by the resistors 11 and 12. The amplifier 300 may be operated either as a differential or single-ended input amplifier provided that due attention is paid to any input voltage restrictions imposed by the biassing conditions. The amplifier 302 is included in order to increase the open loop gain and thereby reduce the closed loop cross-over distortion of the signal amplifier.

Referring now to FIG. 4, a detailed diagram of the transistor bridge which comprises output power stage 5 and output power stage 6 is shown. Output power stage 5 includes transistors 32, 322, 33, 332, 333 and resistor R11. The gate of transistor 32 is adapted to receive the positive output from comparator 31 via connector 101 and the collector is connected to Vcc. The emitter of transistor 32 is connected to the gate of transistor 322. The collector of 322 is connected to Vcc, while the emitter is connected to the collector of transistor 333.

Transistor 33 is adapted to receive at its gate the summed negative signal output via connector 104 from transconductance amplifiers 300 and 301 as shown in the embodiment of FIG. 2, or the negative signal output via connector 104 from transconductance amplifier 302 in the embodiment of FIG. 3. The emitters of transistors 33 and 332 are connected to gates of transistors 332 and 333, respectively. The power stage 5 output OP+ at node 106 is located between the emitter of transistor 332 and the collector of transistor 333. Current sensing resistor R11 is connected between the emitter of transistor 333 and ground as previously discussed in conjunction to FIGS. 1-3.

Output power stage 6 includes transistors 34, 342, 35, 352 and 353 and resistor R12. The gate of transistor 34 is adapted to receive the negative output from comparator 31 via connector 103, and the collector is connected to Vcc. The emitter of transistor 34 is connected to the gate of transistor 342. The collector of transistor 342 is connected to Vcc, while the emitter is connected to the collector of transistor 353.

Transistor 35 is coupled to receive the positive signal output via connector 102 from transconductive amplifiers 300 and 301 as shown in the embodiment of FIG. 2, or the positive signal output via connector 104 from transconductance amplifier 302 in the embodiment shown in FIG. 3. The emitters of transistors 35 and 352 are connected to the gates of transistors 352 are connected to the gates of transistors 352 and 353, respectively. The power stage 6 output OP— at node 107 is located between the emitter of transistor 342 and the collector of transistor 353. Current sensing resistor R12 is connected between the emitter of transistor 353 and ground as previously discussed in conjunction with FIGS. 1-3. Load 36 is connected between OP+ 106 and OP— 107 nodes.

The transistors 80, 81 and 83 along with their associated resistors 201, 202 and 203, respectively, connected between Vcc and the respective transistor emitters and the current source 82 provide a low-level current feed to the output port of the bridge network. The resistors 84 and 85 serve to establish set voltage conditions at the output port particularly when the devices forming the bridge are all nonconductive as in the case when the disable function is operative. Accordingly, the transistor-resistor network provides a biasing network arranged to provide a set output voltage at times when the arms of the bridges are disabled and present a high output impedance. During operation of the network the low current supplied to the output port effects some pull-up at the terminals of the output port during transient operating conditions as each of the devices forming the lower arms of the bridge changes from a conductive to a non-conductive state, and the resistors 84 and 85 serve to oppose the generation of a positive spike as each of the devices forming the upper arms of the bridge changes from a non-conductive to a conductive state.

Referring now to FIG. 5, bandwidth control and control loop stabilization are effected by means of two capacitors 13 and 14, connected between the output port of the transconductance amplifier 301 and the current-sensing resistors 11 and 12. The current control loop formed by the amplifiers 301 and 302, the transistors 33 and 35, and the current sensing resistors 11 and 12, is stabilized by the capacitors 13 and 14 which introduce high-frequency negative feedback to the amplifier 302 in a way similar to Miller stabilization of an operational amplifier. The gain of the loop falls to unity (the —3dB point of transconductance) when the current fed back through either the capacitor 13 or the capacitor 14, that is, according to which of the transistors 33 and 35 is active, is equal to the current output from the amplifier 301. Alternatives to the purely capacitive feedback provided by the capacitors 13 and 14 include resistor-capacitor combinations (resulting in the alteration of the phase margin/transient response by killing higher frequency feedback) the use of a buffer stage to reduce the capacitive loading effect of the capacitors 13 and 14 (of resulting in reduced crossover distortion), and the use of a current amplifier to reduce the values of the capacitors 13 and 14.

Referring now to FIG. 6, a detailed circuit of the retract drive 9 for the voice coil driver of FIG. 1 is shown. A high level input voltage applied to the $\overline{\text{RETR}}$ input port 109 will keep the transistors 506 and 507 switched off. In the off position, no current passes through the load 36. As a result, no current passes through the collector of transistor 508 and the transistor is switched off. Alternatively, a low level input voltage applied to the $\overline{\text{RETR}}$ input port will cause the transistors 506, 507 and 508 to conduct, with the result that current will pass through the current sources consisting of the resistor 505 and the transistors 506 and 507, to the load coil 36 and through the transistor 508. The current passing through the current source 505-506-507 is set by the components amplifier 501, transistor 502, transistor 503, and resistor 504 which represent a bandgap reference providing a reference voltage which, on application to the resistor 22, generates a reference current, which reference current is multiplied through a current mirror which supplies the load current. In the instance where the reference voltage is P volts, the resistor 22 has a value of Q ohms, and the current multiplication is R, then the available load current is PR/Q amps. Suitable values for P, Q, and R are, respectively, 1.25 volts, 1 kD, and 200, in which case the available load current is 250 mA. Practical considerations require that the value of the resistor 22 should not be so small as to permit such flow as to cause the current capacity of either the transistor 507 or the transistor 508 be exceeded, or to cause the voltage developed across the load to back bias the current mirror 505-506-507 excessively. The $\overline{\text{RETR}}$ input is arranged also to disable the normal drive to the output stage, but this is not shown in FIG. 6.

Clamping diodes 601 and 602 are connecting the load coil 36 to the positive side of the voltage supply. The diodes 601 and 602 are present because they are required during normal operation in order to protect the output stages devices from transient conditions which would otherwise damage them. The presence of two diodes 601 and 602 ensures that the voltage level at the load 36 is not held too low in the circumstances where the voltage supply is not at its nominal value or has been lost, that is, zero.

On activation by a signal on the RETR input port 109, a controlled unidirectional current is applied across the voice coil load 32. In a typical application this will impose a unidirectional force or torque on the actuator mechanism, causing it to move to one limit of its mechanical travel. Since the current used is supplied from the separately derived VRETR supply 112, this action will occur independently of the mode of power-down of the VCC supply 111. FIG. 7 illustrates the undervoltage detection arrangements for the signal amplifier. Sample values of the voltage supplies being monitored are obtained by the potential divider chains 705-706 connected in series between Vcc (111) and ground, and 708-709 connected in series between 5 V (110) and ground, respectively, and compared with a reference voltage by means of the comparator comprising the transistors 702, 704 and 707, and the current source 701 and 703. An undervoltage condition for one or both of the supply voltages gives rise to an internal $\overline{\text{RETR}}$ signal which switches off the output stage of the signal amplifier. The undervoltage detection arrangements include significant hysteresis in order to prevent reactivation of the output stages when the supply voltage deviates from the detection threshold by small amounts during undervoltage conditions. The existence of undervoltage conditions also gives rise to a $\overline{\text{RETR}}$ signal, as will be evident from FIG. 1, to bring into operation the circuit represented by FIG. 6.

The major components of the signal amplifier represented by FIG. 1, that is, the voltage-to-current converters 1 and 3, the undervoltage sensing circuit 8, the thermal shutdown circuit 7, the retract drive circuit 9, the disable circuit 10, the pre-drive stage 4, and the output stages 5 and 6 are so configured as to be particularly suitable for implementation as a single monolithic integrated circuit.

The amplifier described above is particularly suitable for driving voice-coil disc head positioning actuators for magnetic storage disc drives, but may be used also for controlling actuators in similar bidirectional position or velocity control systems. The amplifier is capable of providing output current which is insensitive to the load impedance, the time constant of the load, or the back-emf generated by the load. The amplifier bandwidth is controlled by user selectable networks which may include only capacitors. Small signal bandwidths of the order of 20 kHz or more may be achieved, providing minimal phase lag in practical actuations. The device is capable of delivering $\pm 3$ amps output current for a $\pm 3$ volts input signal when energized by a 12 volt supply. When the amplifier is used for disc-head actuator control, the head retract function is executed when a low voltage appears at the power supply input port because of the action of the internal circuitry to pull down the $\overline{\text{RETR}}$ input signal, and the amplifier is arranged to use energy from the spindle motor to effect head retraction under such supply voltage conditions.

The signal amplifier arrangements, in respect of the execution of the "retract" function, may be varied. For example, the network for performing the undervoltage sensing function need not be included within the signal amplifier, in which case an additional external network would be required to perform the undervoltage sensing function and such a network would be connected externally to the retract drive network by way of the $\overline{\text{RETR}}$ input port. Where the amplifier control system includes a network, which may be a logic network, for signalling to the $\overline{\text{RETR}}$ input port in order to effect the "retract" function as one of the normal operating functions of the amplifier, the external undervoltage sensing network may be merged with the network for signalling the "retract" function.

What is claimed:

1. A signal amplifier for driving a load connected across the arms of a bridge network, the amplifier comprising:
   an output stage having a first port electrically coupled to one arm of the bridge network, and a second port electrically coupled to the other arm of the bridge network, each of the ports being capable of existing in a conductive and a non-conductive mode;
   a comparator stage electrically coupled to receive an input signal and to control the first port of the output stage in response to the polarity of the input signal, the first port of the output stage being conductive when the input signal amplitude is zero;
   a modulating stage electrically coupled to receive the input signal and to control the second port of the output stage in response to the polarity of the input signal, the second port of the output stage being conductive when the input signal amplitude is zero; and
   said comparator stage and modulating stage being further responsive to said input signal when the input signal amplitude deviates from zero, so that the appropriate one of the ports of the output stage becomes conductive and the other port becomes non-conductive depending on the input signal's polarity.

2. The signal amplifier of claim 1 further comprising a biasing network electrically coupled to the bridge network, the biasing network engaged to provide a set output voltage to the first port of the output stage when the comparator stage is disabled, and a set output voltage to the second port when the modulating stage is disabled.

3. A signal amplifier as claimed in claim 1, wherein further control devices forming the two further arms of the bridge-connected output stage are both non-conductive when the input signal has zero magnitude, and the appropriate one of the further control devices conducts, according to the input signal polarity and magnitude, as the input signal deviates from zero magnitude.

4. A signal amplifier as claimed in claim 3, so arranged that each of the further control devices becomes conductive after the first control devices located in the opposite arm of the bridge-connected output stage conducts, as the input signal moves away from zero magnitude.

5. A signal amplifier as in claim 2, wherein the biasing network includes a low-level current source located between the higher level supply voltage terminal and the terminals of the output port, and current bleed paths located between the terminals of the output port and the lower level supply voltage terminals.

6. A signal amplifier as claimed in claim 1, wherein the modulating stage is arranged to provide a current dependent on the input signal magnitude for driving the output stage.

7. A signal amplifier as claimed in claim 1, wherein the modulating stage includes a first amplifier network arranged to receive an input signal, a second amplifier network arranged to receive a feedback signal from the output stage, and a summing amplifier network arranged to receive the output signal from the first and second amplifier networks.

8. A signal amplifier as claimed in claim 7, wherein the amplifier networks are provided with differential-input ports.

9. A signal amplifier as claimed in claim 7, in which a feedback network is connected between the output stage and the second amplifier network for amplifier bandwidth control.

10. A signal amplifier as claimed in claim 1, including a voltage monitoring network arranged to monitor the amplifier voltage supply and to control a network for effecting shut-down of the amplifier, the monitoring network being arranged to signal the shut-down network when the voltage supply is below a set value, to effect shut-down of the amplifier.

11. A signal amplifier as claimed in claim 10, including a "retract" network arranged to receive supply energy independently of the amplifier voltage supply and to provide energy direction to the amplifier output port when the voltage monitoring network signals that the voltage supply is below the set value, the "retract" network, in the operation of the amplifier, being capable of returning an actuator to its start position during conditions when the voltage monitoring network is signalling that the voltage supply is below the set value.

12. A signal amplifier as claimed in claim 1, including a "retract" network arranged to receive supply energy from the amplifier supply voltage and to provide energy directly to the amplifier output port in response to a "retract" command signal, the "retract" network, in the operation of the amplifier, being capable of returning an actuator to its start position in response to the "retract" command signal.

13. A signal amplifier as claimed in claim 12, in which the "retract" network is arranged to also receive supply energy independently of the amplifier voltage supply and to provide energy from the independent supply directly to the amplifier output port in response to the "retract" command signal.

14. A signal amplifier as claimed in claim 11, wherein the "retract" network is arranged to provide a constant current to the amplifier output port.

15. A signal amplifier as claimed in claim 11, wherein the "retract" network is arranged to provide a constant voltage at the amplifier output port.

16. A signal amplifier as claimed in claim 1, including a network arranged to monitor the operating temperature of components of the output stage and to control a network for effecting shut-down of the amplifier, the temperature monitoring network being arranged to signal to the shut-down network when the operating temperature of a component of the output stage exceeds a set level, to effect shut-down of the amplifier.

* * * * *

UNITED STATES PATENT AND TRADEMARK OFFICE
CERTIFICATE OF CORRECTION

PATENT NO. : 4,885,517

DATED : December 5, 1989

INVENTOR(S) : John L. Pennock

It is certified that error appears in the above-identified patent and that said Letters Patent is hereby corrected as shown below:

On title page, item [63] should read:

-- Claiming priority from U.K. Application No. 88721329 filed September 10, 1987.--

Signed and Sealed this

Fifth Day of October, 1993

*Attest:*

BRUCE LEHMAN

*Attesting Officer*  *Commissioner of Patents and Trademarks*